United States Patent
Jeong et al.

(10) Patent No.: US 10,354,568 B2
(45) Date of Patent: Jul. 16, 2019

(54) DISPLAY DEVICE HAVING IMPROVED CRACK DETECTION CAPABILITY AND METHOD OF DRIVING THE SAME

(71) Applicant: Samsung Display Co., Ltd., Yongin-si, Gyeonggi-Do (KR)

(72) Inventors: Il-Hun Jeong, Yongin-si (KR); Woo-Seok Jang, Suwon-si (KR)

(73) Assignee: Samsung Display Co., Ltd. (KR)

( * ) Notice: Subject to any disclaimer, the term of this patent is extended or adjusted under 35 U.S.C. 154(b) by 37 days.

(21) Appl. No.: 15/411,784

(22) Filed: Jan. 20, 2017

(65) Prior Publication Data
US 2017/0213490 A1    Jul. 27, 2017

(30) Foreign Application Priority Data

Jan. 21, 2016 (KR) .......................... 10-2016-0007634

(51) Int. Cl.
  *G09G 3/00*  (2006.01)
  *G09G 3/3233*  (2016.01)
  *G09G 3/20*  (2006.01)

(52) U.S. Cl.
  CPC ............. *G09G 3/006* (2013.01); *G09G 3/20* (2013.01); *G09G 3/3233* (2013.01); *G09G 2310/08* (2013.01); *G09G 2320/041* (2013.01); *G09G 2320/043* (2013.01); *G09G 2320/0693* (2013.01); *G09G 2330/12* (2013.01)

(58) Field of Classification Search
  CPC ............. G09G 3/006; G09G 3/3233; G09G 2320/043; G09G 2320/041; G09G 2310/08; G09G 2330/12; G09G 2320/0693; G09G 3/20
  See application file for complete search history.

(56) References Cited

U.S. PATENT DOCUMENTS

| 7,443,641 B2* | 10/2008 | Suzuki ................... H02M 1/32 361/18 |
| 7,675,245 B2* | 3/2010 | Szczeszynski ............ G05F 1/46 315/185 S |
| 9,058,773 B2* | 6/2015 | Park ..................... G09G 3/3233 |
| 9,613,551 B2* | 4/2017 | Lee ......................... G09G 3/006 |
| 9,673,616 B2* | 6/2017 | Park ...................... G09G 3/006 |
| 2003/0122530 A1* | 7/2003 | Hikita ..................... G05F 1/573 323/285 |

(Continued)

FOREIGN PATENT DOCUMENTS

| KR | 10-2014-0141276 A | 12/2014 |
| KR | 10-2015-0095987 A | 8/2015 |

*Primary Examiner* — Grant Sitta
(74) *Attorney, Agent, or Firm* — Innovation Counsel LLP

(57) ABSTRACT

A display device includes a display panel including a plurality of pixels, a power supply transmitting driving power to the pixels via a power line and stopping transmission of the driving power in response to a crack signal, a panel driver provides a driving signal to the pixels, the driving signal for displaying a black image during a non-emission period of each frame period and displaying a valid image during an emission period of each frame period, and a crack detector senses a current flowing through the power line and conditionally generate the crack signal according to values of the current sensed over M successive frame periods, where M is an integer greater than 1.

20 Claims, 11 Drawing Sheets

(56) References Cited

U.S. PATENT DOCUMENTS

| | | | |
|---|---|---|---|
| 2003/0227452 A1* | 12/2003 | Hartular | H02J 7/0063 345/211 |
| 2005/0007316 A1* | 1/2005 | Akimoto | G09G 3/3233 345/76 |
| 2007/0035533 A1* | 2/2007 | Kim | G09G 5/006 345/204 |
| 2008/0111810 A1* | 5/2008 | Park | G09G 3/3233 345/212 |
| 2008/0143655 A1* | 6/2008 | Ko | G09G 3/3291 345/82 |
| 2008/0170024 A1* | 7/2008 | Song | G09G 3/3614 345/96 |
| 2008/0246702 A1* | 10/2008 | Lee | G09G 3/3233 345/77 |
| 2008/0246749 A1* | 10/2008 | Lee | G09G 3/3233 345/207 |
| 2010/0091001 A1* | 4/2010 | Kim | G09G 3/3225 345/211 |
| 2010/0207547 A1* | 8/2010 | Kuroki | H05B 33/0818 315/307 |
| 2011/0025667 A1* | 2/2011 | Chung | G06F 1/3203 345/211 |
| 2011/0115770 A1* | 5/2011 | Seo | G09G 3/32 345/211 |
| 2011/0273422 A1* | 11/2011 | Park | G09G 3/3233 345/211 |
| 2011/0279484 A1* | 11/2011 | Han | G09G 3/3233 345/690 |
| 2012/0050249 A1* | 3/2012 | Jin | G09G 3/20 345/212 |
| 2012/0182328 A1* | 7/2012 | Yoon | G09G 5/10 345/690 |
| 2012/0256897 A1* | 10/2012 | Seo | G09G 3/006 345/212 |
| 2013/0002639 A1* | 1/2013 | Park | G09G 3/3225 345/212 |
| 2013/0002736 A1* | 1/2013 | Park | G09G 3/3225 345/691 |
| 2013/0113773 A1* | 5/2013 | Lee | H05B 33/0815 345/211 |
| 2013/0235016 A1* | 9/2013 | Seo | G09G 3/3208 345/212 |
| 2013/0241808 A1* | 9/2013 | Kwon | H02M 3/158 345/76 |
| 2014/0028646 A1* | 1/2014 | Saitoh | G09G 3/3614 345/209 |
| 2014/0084792 A1* | 3/2014 | Oh | H05B 37/02 315/120 |
| 2014/0362072 A1* | 12/2014 | Park | G09G 3/006 345/212 |
| 2015/0116302 A1* | 4/2015 | Kim | G09G 3/006 345/212 |
| 2017/0271866 A1* | 9/2017 | Park | G09G 3/006 |

* cited by examiner

DISPLAY DEVICE HAVING IMPROVED CRACK DETECTION CAPABILITY AND METHOD OF DRIVING THE SAME

CROSS REFERENCE TO RELATED APPLICATION

This application claims priority under 35 U.S.C. § 119 to Korean patent Application No. 10-2016-0007634 filed on Jan. 21, 2016, the disclosure of which is hereby incorporated by reference herein in its entirety.

BACKGROUND

1. Technical Field

Example embodiments of the inventive concept relate generally to display devices. More particularly, example embodiments of the inventive concept relate to display devices having improved crack detection capability and methods of driving such display devices.

2. Description of the Related Art

Typically, a display device includes a display panel having a plurality of pixels that receive signals from a driving power source. For example, an organic light emitting display device may include pixels each employing an organic light emitting diode (OLED). The OLED includes an organic layer between two electrodes, namely, an anode and a cathode. The holes from the anode may be combined with the electrons from the cathode in the organic layer between the anode and the cathode, to emit light. Accordingly, the display device displays a valid image.

The display panel commonly supplies power to its pixels via a first power line which is a positive power source and a second power line which is a negative power source. The first power line may overlap the second power line. When a short circuit occurs between the first power line and the second power line, a heating problem may occur or a fire may be caused because of an over current.

SUMMARY

Example embodiments provide a display device capable of improving the reliability of crack detection.

Example embodiments provide a method of driving the display device.

According to some example embodiments, a display device may include a display panel including a plurality of pixels, a power supply configured to transmit driving power to the pixels via a power line and configured to stop transmission of the driving power source in response to a crack signal; a panel driver configured to provide a driving signal to the pixels, the driving signal for displaying a black image during a non-emission period of each frame period and displaying a valid image during an emission period of each frame period; and a crack detector configured to sense a current flowing through the power line and configured to conditionally generate the crack signal according to values of the current sensed over M successive frame periods, where M is an integer greater than 1.

In example embodiments, the crack detector may include a first current sensor configured to measure a value of a first sensed current flowing through the power line during the non-emission period and configured to store the measured value of the first sensed current in a current value storage, and a signal generator configured to derive an average value of the first sensed current from values of the first sensed current that are sensed over N successive frame periods and retrieved from the current value storage, and further configured to generate the crack signal when a difference between successively derived ones of the average values and a first reference current value is greater than a first threshold value for each of the M successive frame periods, where N is an integer greater than 1.

In example embodiments, the crack detector further may include a reference value provider configured to provide the first reference current value and the first threshold value to the signal generator.

In example embodiments, the reference value provider may adjust the first reference current value and the first threshold value based on a temperature of the display panel.

In example embodiments, the reference value provider may adjust the first reference current value and the first threshold value based on deterioration data of the pixels.

In example embodiments, the crack detector may further include a second current sensor configured to measure a value of a second sensed current flowing through the power line during the emission period.

In example embodiments, the signal generator may generate the crack signal when a difference between successively derived ones of the second sensed current and a second reference current value is greater than a second threshold value for each of the M successive frame periods.

In example embodiments, the crack detector may further include a reference value provider configured to generate the second reference current value based on input image data and configured to provide the second reference current value and the second threshold value to the signal generator.

In example embodiments, the crack detector may include a second current sensor configured to measure a value of a second sensed current flowing through the power line during the emission period, and a signal generator configured to generate the crack signal when a difference between the value of the second sensed current and a second reference current value is greater than a second threshold value for each of the M successive frame periods.

In example embodiments, the crack detector may sense the current every frame period.

In example embodiments, the non-emission period may include an initialization period and a scan period. The crack detector may sense the current during the scan period.

In example embodiments, each frame period may include a plurality of non-emission periods. The crack detector may sense the current during one of the non-emission periods in which the driving signal is maintained at a substantially constant voltage.

According to some example embodiments, a display device may include a display panel including a plurality of pixels; a power supply configured to transmit first power to the pixels via a first power line, configured to transmit second power to the pixels via a second power line, and configured to stop transmission of the first power and the second power based on a crack signal; a panel driver configured to provide a driving signal; and a crack detector configured to sense a current flowing through at least one selected from the first power line and the second power line, and configured to conditionally generate the crack signal according to values of the current sensed over M successive frame periods, where M is an integer greater than 1.

In example embodiments, the crack detector may include a third current sensor configured to measure a value of a third sensed current flowing through the first power line, a fourth current sensor configured to measure a value of a fourth sensed current flowing through the second power line, and a signal generator configured to generate the crack signal when a difference between a value of the third sensed current and a third reference current value is greater than a third threshold value for each of the M successive frame periods, and when a difference between a value of the fourth sensed current and a fourth reference current value is greater than a fourth threshold value for each of the M successive frame periods.

In example embodiments, the crack detector may further include a reference value provider configured to generate the third reference current value and the fourth reference current value based on input image data and configured to provide the third reference current value and the fourth reference current value to the signal generator.

In example embodiments, the reference value provider may adjust the third reference current value and the fourth reference current value based on a temperature of the display panel.

In example embodiments, the reference value provider may adjust the third reference current value and the fourth reference current value based on deterioration data of the pixels.

According to some example embodiments, a method of driving a display device, configured to display a black image during a non-emission period of each frame period and to display a valid image during an emission period of each frame period, may include: sensing a first current flowing through a power line during the non-emission period; deriving an average value of the first current corresponding to N successive frame periods, where N is an integer greater than 1; generating a crack signal when a difference between the average value and a first reference current value is greater than a first threshold value for at least M successive frame periods, where M is an integer greater than 1; and stopping transmission of a driving signal to the display device based on the crack signal.

In example embodiments, the method may further include sensing a second current flowing through the power line during the emission period, and an operation of generating the crack signal when a difference between the value of the second current and a second reference current value is greater than a second threshold value for at least the M successive frame periods.

In example embodiments, the second reference current value may be adjusted based on input image data.

Therefore, a display device according to example embodiments senses a first current flowing through the power line in the non-emission period, derives an average value of the first current corresponding to N successive frame periods, and determines whether the average value of the first current falls within a normal current range during M successive frame periods, to detect cracks in the display panel. In addition, the display device senses a second current flowing through the power line during the emission period, determines whether the second sensing current falls within a normal current range during M successive frame periods, to detect cracks in the display panel. Further, the display device adjusts reference values for detecting the cracks according to a driving environment such as a temperature of the display panel, a deterioration degree of the pixels, etc. Accordingly, the display device can improve the reliability of crack detection.

A method of driving a display device according to example embodiments can cut off power sources when the short circuit occurs, thereby preventing a fire due to an over current.

BRIEF DESCRIPTION OF THE DRAWINGS

Exemplary embodiments will be described more fully hereinafter with reference to the accompanying drawings, in which various embodiments are shown.

DESCRIPTION OF EMBODIMENTS

Exemplary embodiments will be described more fully hereinafter with reference to the accompanying drawings, in which various embodiments are shown. The drawings may not be to scale. All numerical values are approximate, and may vary. All examples of specific materials and compositions are to be taken as nonlimiting and exemplary only. Other suitable materials and compositions may be used instead.

Figure 1:
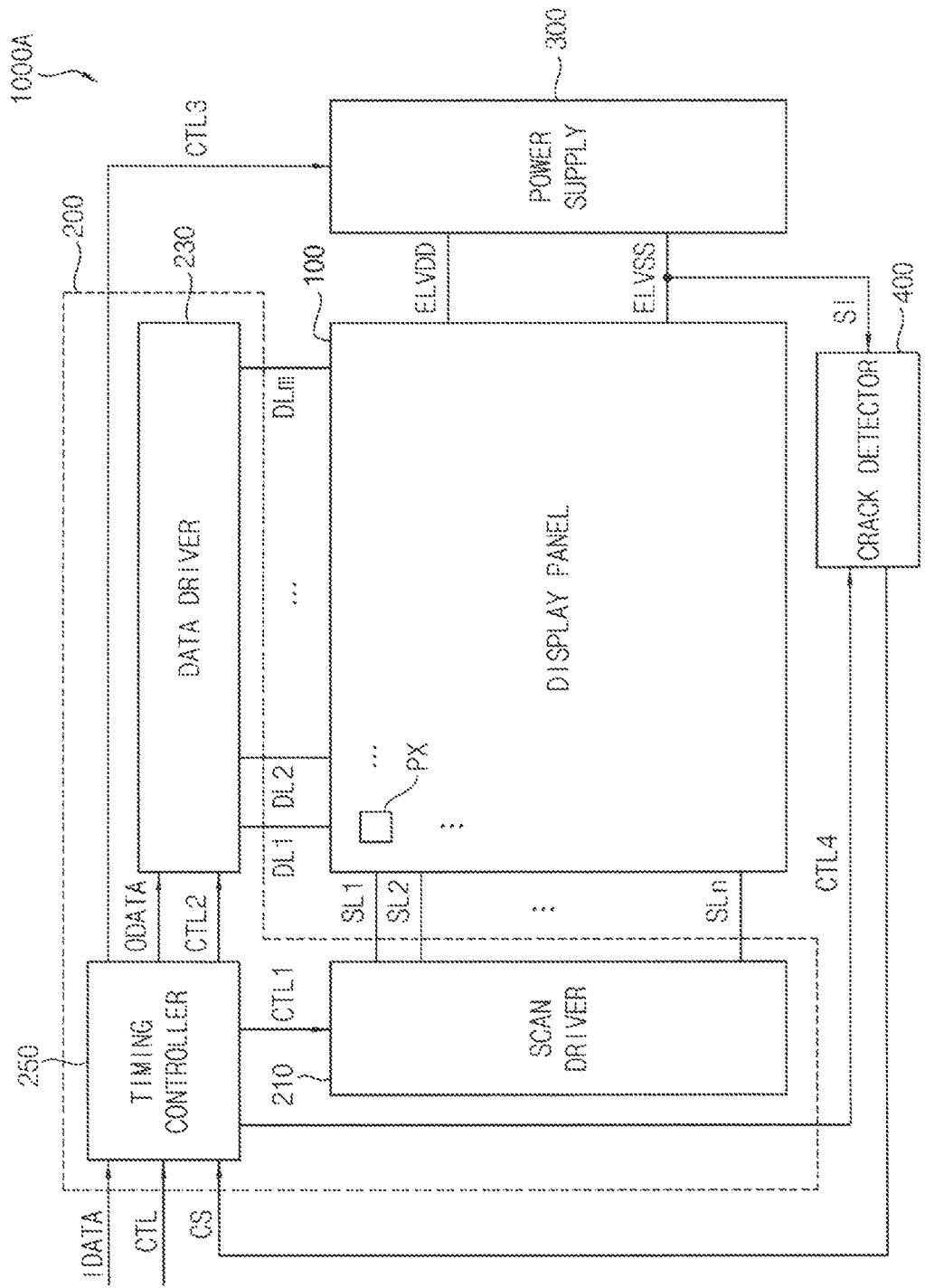
FIG. 1 is a block diagram illustrating a display device according to one example embodiment.

FIG. 1 is a block diagram illustrating a display device according to one example embodiment.

Referring to FIG. 1, the display device 1000A may include a display panel 100, a panel driver 200, a power supply 300, and a crack detector 400.

The display panel 100 may include a plurality of pixels PX. For example, the display panel 100 may include n*m pixels PX because the pixels PX are arranged at locations corresponding to crossing points of the scan lines SL1 through SLn and the data lines DL1 through DLm.

The panel driver 200 may provide a driving signal to the pixels PX of the display panel 100, to display an image. The panel driver 200 may provide a driving signal for displaying a black image in a non-emission period of each frame period, and for displaying a valid image in an emission period of each frame period, to the pixels PX. In one example embodiment, the panel driver 200 may drive the display panel 100 in a simultaneous emission manner. When driven in the simultaneous emission manner, the data signal is progressively provided in the non-emission period of one frame period, and all the pixels PX are driven to simultaneously emit light based on the data signal.

In one example embodiment, the panel driver 200 may include a scan driver 210, a data driver 230, and a timing controller 250. The scan driver 210 may provide a scan signal to the pixel PX via the scan lines SL1 through SLn, based on the first driving control signal CTL1. The data driver 230 may provide a data signal to the pixels PX via the data lines DL1 through DLm, based on a second control signal CTL2. The timing controller 250 may receive input image data IDATA and a control signal CTL, may generate a digital data signal (i.e., output image data ODATA) based on the input image data IDATA, and may generate the first through fourth driving control signals CTL1 through CTL4 based on the control signal CTL. As an example, the control signal CTL may include a vertical synchronizing signal, a horizontal synchronizing signal, a master clock signal, and a data enable signal. In one example embodiment, the timing controller 250 may receive a crack signal CS from the crack detector 400, may cut off a driving power source in response to the crack signal CS, and may generate driving control signals for stopping driving of the display panel 100.

The power supply 300 may provide a driving power source to the pixels PX via the power line. In one example embodiment, the power supply 300 may provide a first power source ELVDD and a second power source ELVSS to the pixels PX. A voltage level of the second power source ELVSS may be lower than a voltage level of the first power source ELVDD. For example, the first power source ELVDD may correspond to a positive driving voltage and the second power source ELVSS may correspond to a negative driving voltage. In addition, the power supply 300 may receive the third driving control signal CTL3 including the crack signal CS, and may cut off the driving power source based on the crack signal. Thus, when an over current occurs due to a crack in the display panel 100, the power supply 300 may cut off the driving power source to prevent a fire.

The crack detector 400 may sense a sensing current SI flowing through the ELVSS power line, and may monitor the sensing current SI during M successive frame periods to generate the crack signal CS, where M is an integer greater than 1. For example, when an external force is applied to the display panel 100, a short circuit can occur between the first power line via (ELVDD) and the second power line via (ELVSS). Also, a short circuit can occur between a power line (e.g., the first power source, the second power source, etc) and a signal line (e.g., the data line, the scan line, etc). A current flowing through the power line can be changed by the short circuit, so that the crack detector 400 may determine whether the crack occurs or not by monitoring the current flowing through the power line. In conventional systems, a crack detection error can occur due to a momentary or short-duration over current generated by external environmental factors or driving environmental factors. Accordingly, the crack detector 400 may improve a reliability of crack detection by monitoring whether the over current consistently occurs during the predetermined number of frame periods. The crack detector 400 may sense the sensing current SI every frame period, or in a predetermined number of frame periods.

In one example embodiment, the crack detector 400 may measure a value of a first sensing current flowing through the second (ELVSS) power line via during the non-emission period, and may detect a crack of the display panel 100 based on the average value of the first sensing currents measured in N successive frame periods. In one example embodiment, the crack detector 400 may measure a value of a second sensing current flowing through the second power line in the emission period, and may detect a crack in the display panel 100 based on the second sensing current. Here, the crack detector 400 may improve the reliability of crack detection by adjusting reference values for detecting the crack according to a driving environment of the display device 1000A. Hereinafter, a structure of the crack detector 400 will be described in more detail with reference to the FIGS. 2 and 7.

Although the example embodiments of FIG. 1 describe that the crack detector 400 senses a current flowing through the second power line, embodiments of the invention are not limited thereto. For example, the crack detector 400 may instead sense a current flowing through the first power line (ELVDD) via.

Although example embodiments of FIG. 1 describe that the crack detector 400 provides the crack signal CS to the timing controller 250 and the timing controller 250 controls the power supply 300 based on the crack signal CS, embodiments of the invention are not limited thereto. For example, the crack detector 400 may instead directly provide the crack signal CS to the power supply 300.

Figure 2:
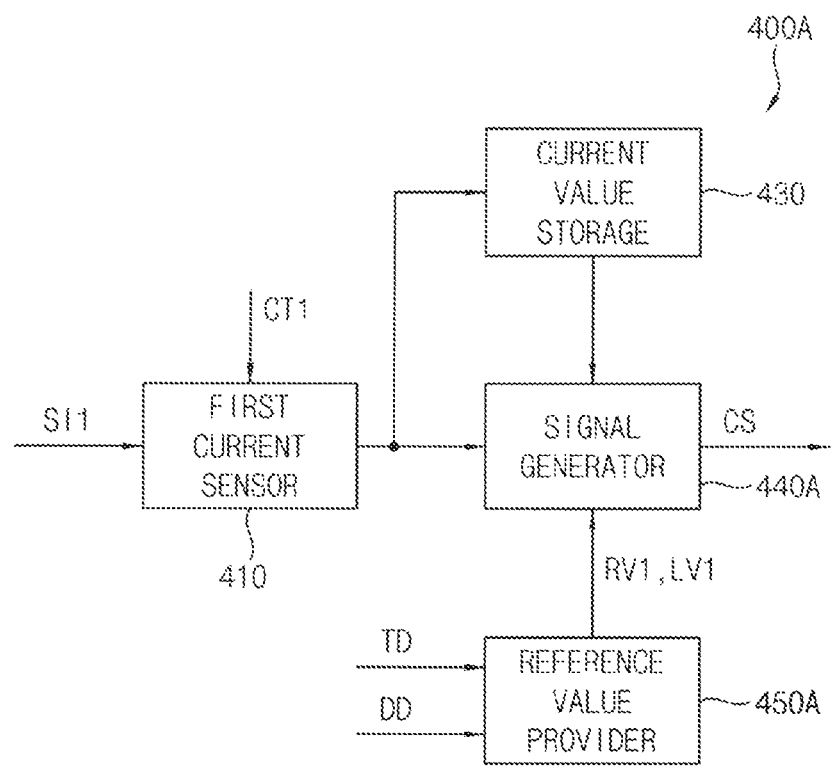
FIG. 2 is a block diagram illustrating one example of a crack detector included in a display device of FIG. 1.

FIG. 2 is a block diagram illustrating one example of a crack detector included in a display device of FIG. 1.

Referring to FIG. 2, the crack detector 400A, which may be considered as one specific embodiment of crack detector 400, may include a first current sensor 410, a current value storage 430, a signal generator 440A, and a reference value provider 450A.

In response to the first sensing control signal CT1, the first current sensor 410 may measure a value of a first sensing current SI1 flowing through the power line in the non-emission period, and may store the value of the first sensing current SI1 in the current value storage 430. Because the pixels display a black image in the non-emission period, a magnitude of the first sensing current SI1 is constant (e.g., 0 A) regardless of the data signal. Therefore, the first current sensor 410 may improve the reliability of crack detection by measuring the value of the first sensing current SI1 in the non-emission period. In one example embodiment, the first current sensor 410 may include a current integrator and an analog-digital converter (ADC) to convert the first sensing current SI1 into a digital signal. Also, the first current sensor 410 may further include a switch connecting the power line to the current integrator in response to the first sensing control signal CT1.

The value of the first sensing current SI1 measured by the first current sensor 410 may be stored in the current value storage 430 to derive an average value of the first sensing current SI1 corresponding to N successive frame periods. In one example embodiment, the current value storage 430 may include a volatile memory device. When the value of the first sensing current SI1 is stored in the volatile memory device, the average value of the first sensing current SI1 may be relatively rapidly derived. For example, the current value storage 430 may include a dynamic random access memory (DRAM), a static random access memory (SRAM), etc. In another example embodiment, the current value storage 430 may include a non-volatile memory device. The non-volatile memory device may have a variety of advantages such as capability to store large amounts of data, low cost, etc. For example, the current value storage 430 may include flash memory, erasable programmable read-only memory (EPROM), electrically erasable programmable read-only memory (EEPROM), phase change random access memory (PRAM), etc.

The signal generator 440A may derive an average value of the first sensing current SI1 corresponding to N successive frame periods from the current value storage 430, where N is an integer greater than 1. Thus, the signal generator 440A may determine whether a crack in the display panel occurs or not, based on the derived average value, as a magnitude of the first sensing current SI1 is constant regardless of the data signal in the non-emission period, under normal conditions. Therefore, the signal generator 440A may improve a reliability of crack detection.

In addition, the signal generator 440A may generate the crack signal CS when a difference between the average value and a first reference current value RV1 is greater than a first threshold value LV1 during the M successive frame periods, where M is an integer greater than 1. Thus, the signal generator 440A may consistently monitor whether the over current occurs or not during the M successive frame periods, thereby preventing a crack detection error due to a momentary over current. Generally, when M is relatively large, a reliability of crack detection is relatively high, but the risk of fire can increase because the driving power source is cut off relatively late. On the other hand, when M is relatively small, the risk of fire can decrease, but the chance of crack detection error can increase due to momentary over currents.

The reference value provider 450A may provide the first reference current value RV1 and the first threshold value LV1 to the signal generator 440A. The first reference current value RV1 and the first threshold value LV1 may be predetermined, or may be adjusted according to a driving environment.

In one example embodiment, the reference value provider 450A may adjust the first reference current value RV1 and the first threshold value LV1 based on a temperature TD of the display panel. For example, when the temperature TD of the display panel increases as external temperature or driving time increases, the first sensing current SI1 may increase and the value of the first sensing current SI1 may have a larger error range. Therefore, the reference value provider 450A may receive the temperature TD of the display panel from a temperature sensor or other source, and may adjust the first reference current value RV1 and the first threshold value LV1 using a look-up table (LUT) or an equation relating the temperature TD of the display panel to a reference value (i.e., the first reference current value RV1 and/or the first threshold value LV1)

In another example embodiment, the reference value provider 450A may adjust the first reference current value RV1 and the first threshold value LV1 based on deterioration data DD of the pixels PX. For example, the first sensing current SI1 may increase and the value of the first sensing current SI1 may have a correspondingly larger error range as the pixels PX deteriorate.

Therefore, the reference value provider 450A may receive the deterioration data DD (e.g., an accumulative driving data generated by, e.g., accumulatively storing the data signal, or the like) and may adjust the first reference current value RV1 and the first threshold value LV1 using a LUT or an equation relating the deterioration data DD to the reference value.

Figure 3:
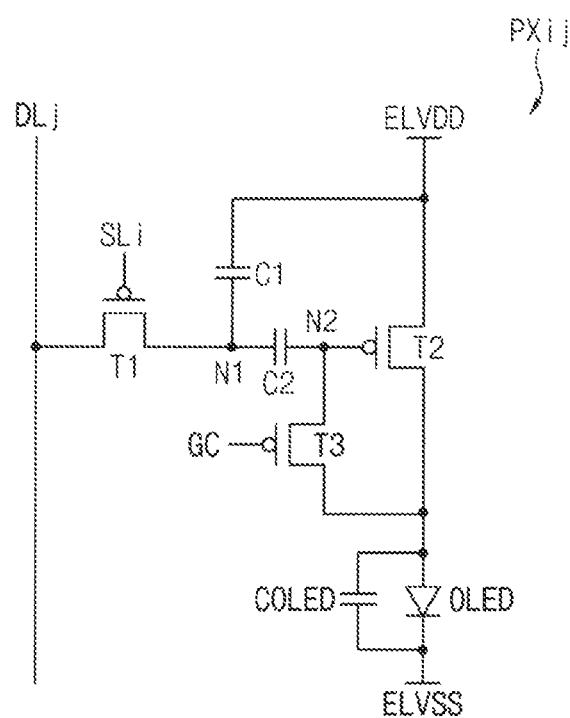
FIG. 3 is a circuit diagram illustrating an example of a pixel included in a display device of FIG. 1.
Figure 4A:
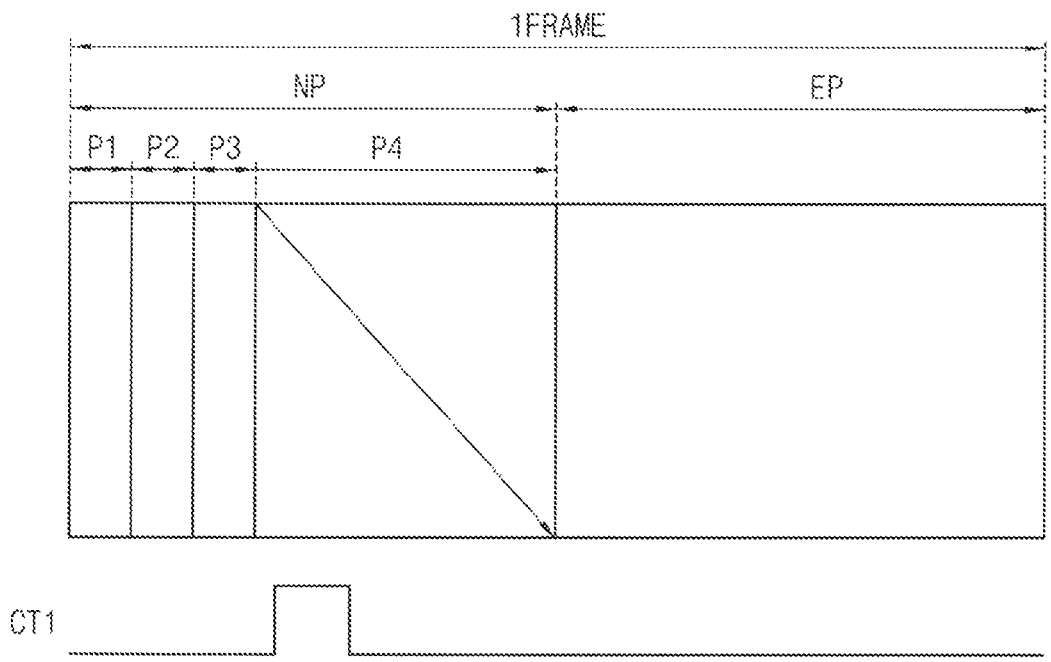
FIGS. 4A and 4B are diagrams illustrating examples in which a display device of FIG. 1 senses a first sensing current during a non-emission period.
Figure 4B:
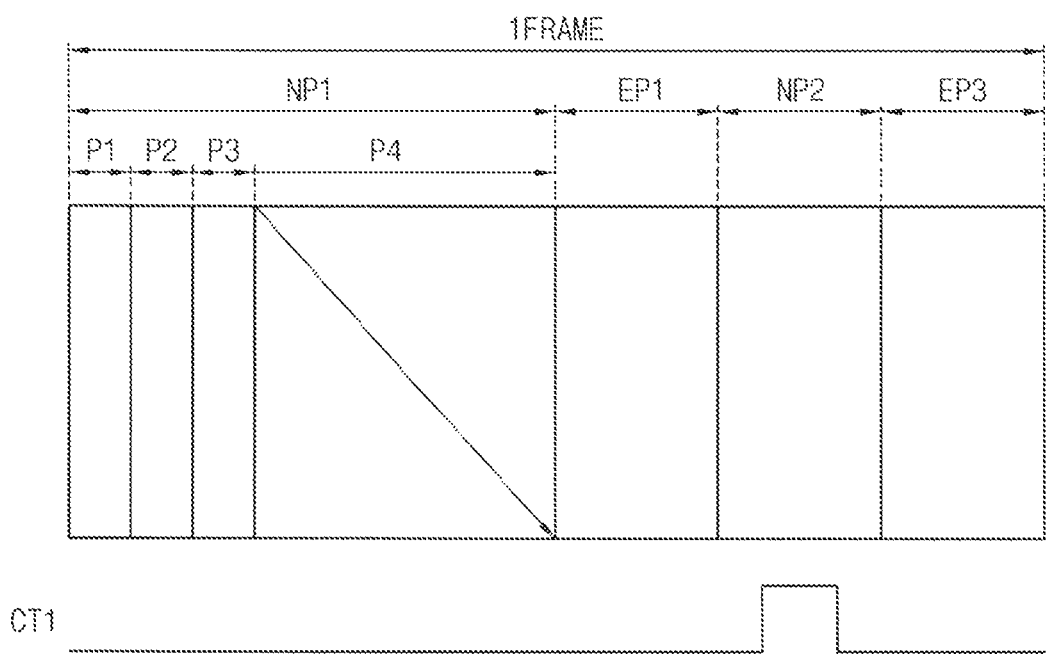

FIG. 3 is a circuit diagram illustrating an example of a pixel included in a display device of FIG. 1. FIGS. 4A and 4B are diagrams illustrating examples in which a display device of FIG. 1 senses a first sensing current during a non-emission period.

Referring to FIGS. 3, 4A and 4B, the display device may be driven in a simultaneous emission manner. One frame period may include a non-emission period and an emission period. Each pixel PXij may display a black image in the non-emission period, and display a valid image in the emission period. The crack detector may sense a current (i.e., the first sensing current) flowing through a power line during the non-emission period, to determine whether a crack has occurred.

As shown in FIG. 3, the pixel PXij may include first through third transistors T1 through T3, first and second capacitors C1 and C2, and an organic light emitting diode OLED.

The first transistor T1 may include a gate electrode connected to a scan line SLi, a first electrode connected to a data line DLj, and a second electrode connected to a first node N1. Thus, a scan signal may be applied to the gate electrode of the first transistor T1, and a data signal may be applied to the first electrode of the first transistor T1.

The second transistor T2 may include a gate electrode connected to a second node N2, a first electrode connected to a first power source ELVDD, and a second electrode connected to a first electrode of the OLED. Here, the second transistor T2 may be a driving transistor.

The first capacitor C1 may be connected between the first node N1 and the first electrode of the second transistor T2. The second capacitor C2 may be connected between the first node N1 and the second node N2.

The third transistor T3 may include a gate electrode connected to a common control line GC, a first electrode connected to the second node N2, and a second electrode connected to both the first electrode of the OLED and the second electrode of the second transistor T2. Accordingly, a common control signal may be applied to the gate electrode of the third transistor T3. When the third transistor T3 is turned-on, the gate electrode of the second transistor T2 may be connected to the second electrode of the second transistor T2 (i.e., diode connection).

The first electrode of the OLED may be connected to both the second electrode of the second transistor T2 and the second electrode of the third transistor T3. The second electrode of the OLED may be connected to a second power source ELVSS. The OLED may emit light corresponding to a driving current provided from the second transistor T2.

As shown in FIG. 4A, the pixel may be driven in a simultaneous emission manner. Each frame period may include an emission period EP and a non-emission period NP. For example, the non-emission period NP may include an initialization period P1, a reset period P2, a threshold voltage compensation period P3, and a scan period P4.

In the initialization period P1, the first and second nodes in the pixels may be initialized. For example, the scan signal may be applied to the pixel and the data signal may be set at an initialization voltage level.

In the reset period P2, a data voltage applied to the pixel may be reset. For example, the data signal may be set at a voltage level lower than a voltage level of the scan signal, and a voltage level of the first electrode of the OLED may be lower than a voltage level of the second electrode of the OLED in the reset period P2.

In the threshold voltage compensation period P3, a threshold voltage of the driving transistor (i.e., the second transistor) of the pixel may be stored in the first capacitor. Accordingly, it is possible to prevent degradation in the display quality due to deviation of the threshold voltage of the driving transistor.

In the scan period P4, the scan signal may be progressively applied to the scan lines. In response, the data signal provided from the data lines may be progressively applied to the pixels.

In the emission period EP, the driving current corresponding to the data signal stored in each pixel may be provided to the corresponding OLED, thereby emitting light.

In one example embodiment, as shown in FIG. 4A, the first sensing control signal CT1 may be applied to the first current sensor of the crack detector in at least a portion of the scan period P4 of the non-emission period NP, and then the first sensing current may be sensed. In the normal driving state, the first sensing current may be constant regardless of the data signal because the driving current may not flow through the OLED during the scan period P4 (i.e., during the non-emission period NP). Therefore, the crack detector can readily determine whether the crack occurs or not by monitoring the first sensing current during the scan period P4.

In another example embodiment, as shown in FIG. 4B, one frame period may include a plurality of non-emission periods (e.g., a first emission period NP1 and a second non-emission period NP2). The crack detector may sense the first sensing current in at least a portion of one of the non-emission periods (e.g., the second non-emission period NP2) that does not include the scan period P4 in which the data signal corresponding to a valid image is applied to the pixels. If the first sensing current is sensed in the scan period P4, a coupling noise can occur due to parasitic capacitance between a data line and a power line. Therefore, to minimize noise in the first sensing current, the first sensing control signal CT1 may be applied to the first current sensor, and the first sensing current may be sensed, during a non-emission period in which the scan period P4 does not exist and the driving signal is maintained at a substantially constant voltage.

Figure 5:
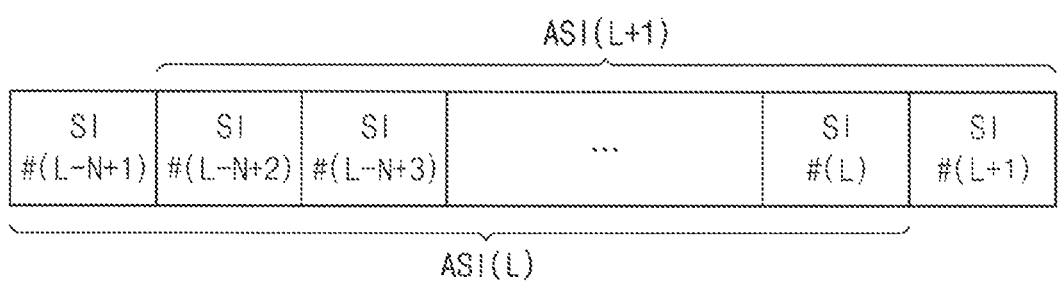
FIG. 5 is a diagram for describing a method of deriving an average value of a first sensing current sensed during a non-emission period, so as to detect a crack.

FIG. 5 is a diagram for describing a method of deriving an average value of a first sensing current sensed during a non-emission period, so as to detect a crack.

Referring to FIG. 5, a signal generator may derive an average value of the first sensing current corresponding to N successive frame periods, from the current value storage, where N is an integer greater than 1. For example, in the (L)th frame period, where L is an integer greater than N, the signal generator may calculate the (L)th average value ASI(L) of the first sensing current, corresponding to the (L−N+1)th through (L)th frame periods, from the current value storage. In the (L+1)th frame period, the signal generator may calculate the (L+1)th average value ASI(L+1) of the first sensing current, corresponding to the (L−N+2)th through (L+1)th frame periods, from the current value storage.

The signal generator may generate the crack signal when the average value does not belong to a normal current range. For example, when difference values between each of the (L)th through (L+M−1)th average values and a reference current value are greater than a threshold value, the signal generator may generate the crack signal.

Figure 6:
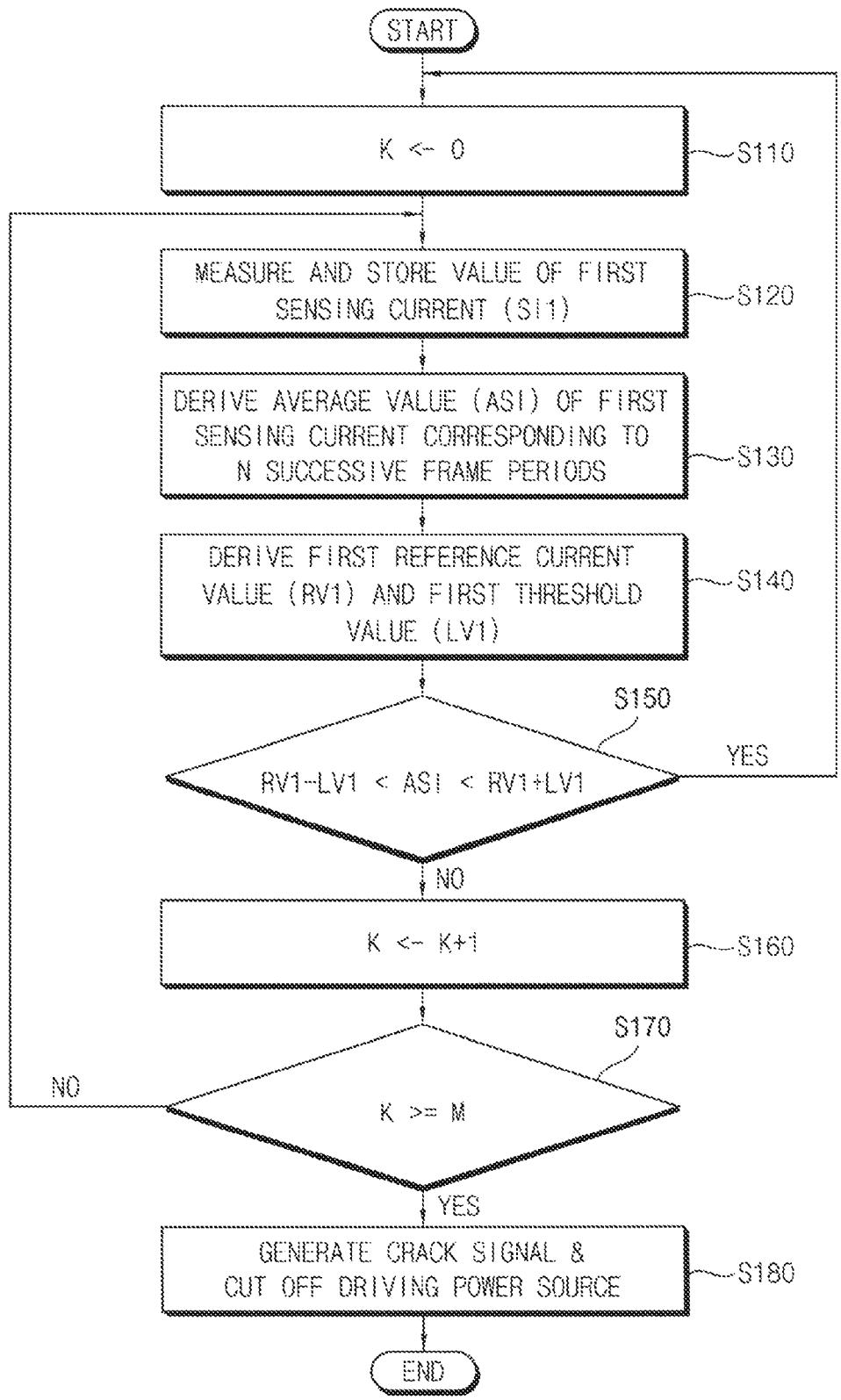
FIG. 6 is a flow chart illustrating an example of a method of detecting a crack in a display panel based on a first sensing current sensed during a non-emission period.

FIG. 6 is a flow chart illustrating an example of a method of detecting a crack in a display panel based on a first sensing current sensed during a non-emission period.

Referring to FIG. 6, a variable K may be initialized to 0 (S110). Here, K indicates the number of times that an abnormal current is sensed. The abnormal current indicates a sensing current outside of a normal current range. The first sensing current SI1 flowing through the power line may be sensed in the non-emission period, and may be stored in a memory device (S120).

An average value ASI of the first sensing current, corresponding to N successive frame periods, may be derived from the sensing current values stored in the memory device (S130). A first reference current value RV1 and a first threshold value LV1, that are adjusted according to a driving environment, may be derived (S140).

It is then checked whether the average value ASI of the first sensing current belongs to a normal current range or not (S150). Thus, if the average value ASI is greater than a value obtained by subtracting the first threshold value LV1 from the first reference value RV1, or is smaller than a value obtained by adding the first reference value RV1 and the first threshold value LV1, the sensed current may correspond to a normal current. In this case, the variable K may be kept at 0 because the average value belongs to the normal current range (S110). On the other hand, if the average value ASI is less than or equal to the value obtained by subtracting the first threshold value LV1 from the first reference value RV1, or is greater than or equal to the value obtained by adding the first reference value RV1 and the first threshold value LV1, the sensed current may correspond to an abnormal current and the variable K may be incremented by 1 (S160).

The variable K may be compared to a reference value M for crack detection (S170). If the variable K is smaller than the reference value M, the first sensing current in the next frame period is sensed, to check whether abnormal current is consistently sensed. On the other hand, if the variable K is greater than or equal to the reference value M, a crack in the display panel is determined to have occurred. Accordingly, the crack signal may be generated and the driving power source may be cut off (S180).

Figure 7:
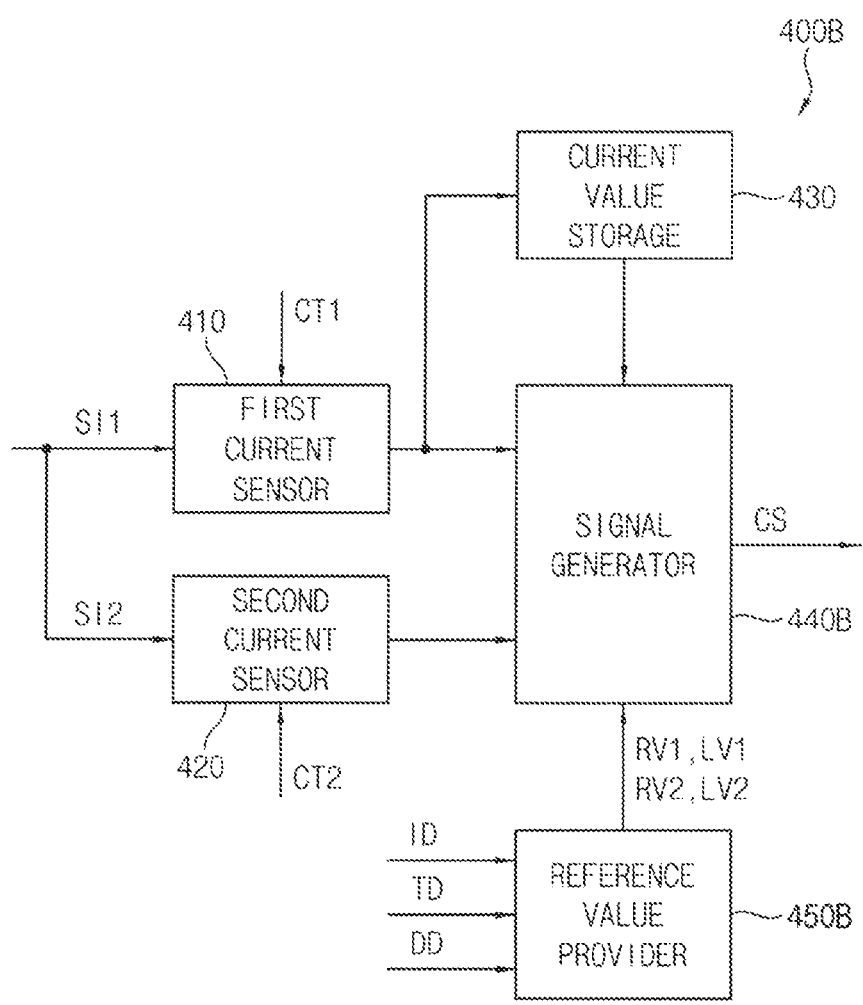
FIG. 7 is a block diagram illustrating another example of a crack detector included in a display device of FIG. 1.
Figure 8:
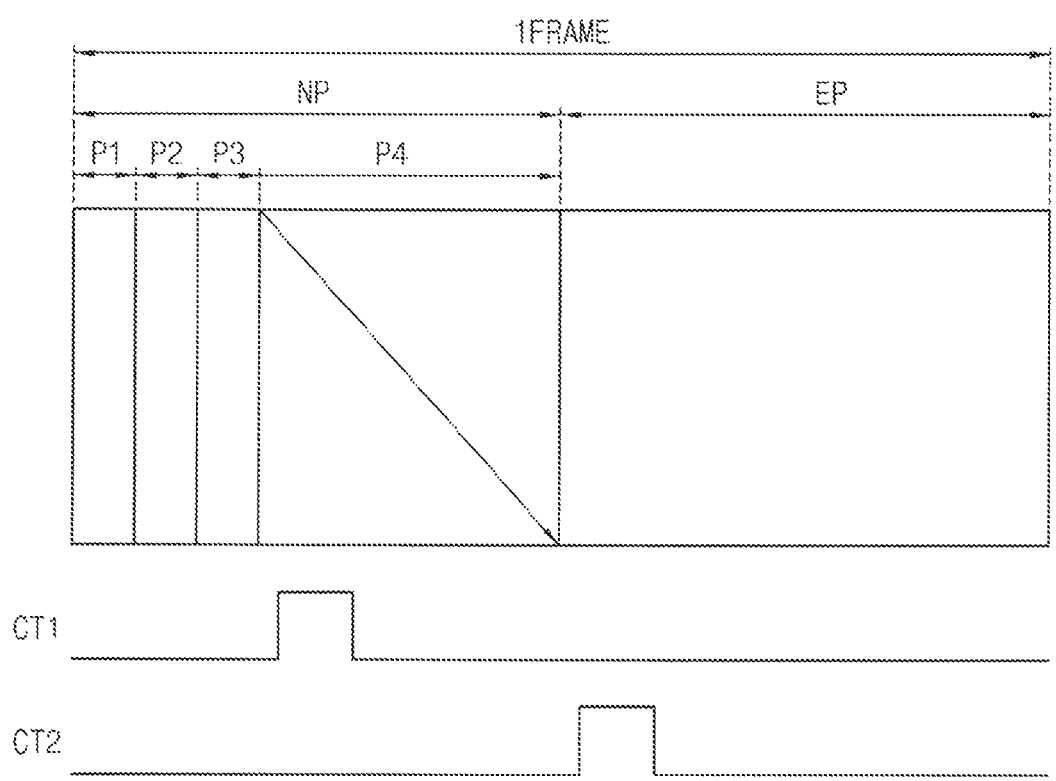
FIG. 8 is a diagram illustrating an example in which a display device of FIG. 1 senses a second sensing current during an emission period.

FIG. 7 is a block diagram illustrating another example of a crack detector included in a display device of FIG. 1. FIG. 8 is a diagram illustrating an example in which a display device of FIG. 1 senses a second sensing current during an emission period.

Referring to FIGS. 7 and 8, the crack detector 400B, which is another specific implementation of crack detector 400, may include a first current sensor 410, a second current sensor 420, a current value storage 430, a signal generator 440B, and a reference value provider 450B. The crack detector 400B according to the present exemplary embodiment is substantially the same as the crack detector 400A of the exemplary embodiment described in FIG. 2, except that the second current sensor 420 is added. Therefore, the same reference numerals will be used to refer to the same or like parts as those described in the previous exemplary embodiment of FIG. 2, and any repetitive explanation concerning the above elements will be omitted.

The first current sensor 410 may measure a value of a first sensing current SI1 flowing through the power line during the non-emission period, in response to the first sensing control signal CT1. The first current sensor 410 may also store the value of the first sensing current SI1 in the current value storage 430. The second current sensor 420 may measure a value of a second sensing current SI2 flowing through the power line during the emission period, in response to the second sensing control signal CT2. As shown in FIG. 8, the first sensing control signal CT1 may be applied to the first current sensor 410 of the crack detector 400B during the scan period P4 of the non-emission period NP, and then the first sensing current SI1 may be sensed in response to the first sensing control signal CT1. Also, the second sensing control signal CT2 may be applied to the second current sensor 420 of the crack detector 400B in at least a part of the emission period EP, and then the second sensing current SI2 may be sensed in response to the second sensing control signal CT2.

The signal generator 440B may derive an average value of the first sensing current SI1 corresponding to N successive frame periods, where N is an integer greater than 1. The signal generator 440B may generate the crack signal CS when a difference between this average value and a first reference current value RV1 is greater than a first threshold value LV1 during M1 successive frame periods, where M1 is an integer greater than 1. In addition, the signal generator 440B may generate the crack signal CS when a difference between the second sensing current SI2 and a second reference current value RV2 is greater than a second threshold value LV2 during M2 successive frame periods, where M2 is an integer greater than 1. Thus, the signal generator 440B may check whether the crack occurs or not, based on either the first sensing current SI1 sensed during the non-emission period or the second sensing current SI2 sensed during the emission period.

The reference value provider 450B may provide the first reference current value RV1, the first threshold value LV1, the second reference current value RV2, and the second threshold value LV2 to the signal generator 440B. In one example embodiment, the reference value provider 450B may adjust the first reference current value RV1, the first threshold value LV1, the second reference current value RV2, and the second threshold value LV2 based on a temperature TD of the display panel. In another example embodiment, the reference value provider 450B may adjust the first reference current value RV1, the first threshold value LV1, the second reference current value RV2, and the second threshold value LV2 based on deterioration data DD of the pixels.

In one example embodiment, the reference value provider 450B may generate the second reference current value RV2 and the second threshold value LV2 based on input image data ID, and may provide the second reference current value RV2 and the second threshold value LV2 to the signal generator 440B. Because the pixels display a valid image during the emission period, a magnitude of the second sensing current SI2 flowing through the power line may vary according to the input image data ID. Therefore, the reference value provider 450B may generate the second reference current value RV2 and the second threshold value LV2 based values stored in a LUT indicating the relationship between the input image data ID and reference values (i.e., the second reference current value RV2 and the second threshold value LV2).

The crack detector 400B may sense the current flowing through the power line during the emission period as well as the non-emission period, by including the second current sensor 420, to check whether a crack has occurred. Thus, the crack detector 400B may more frequently check whether the crack occurs or not, thereby reducing a time interval for crack detection and improving a reliability of crack detection.

Figure 9:
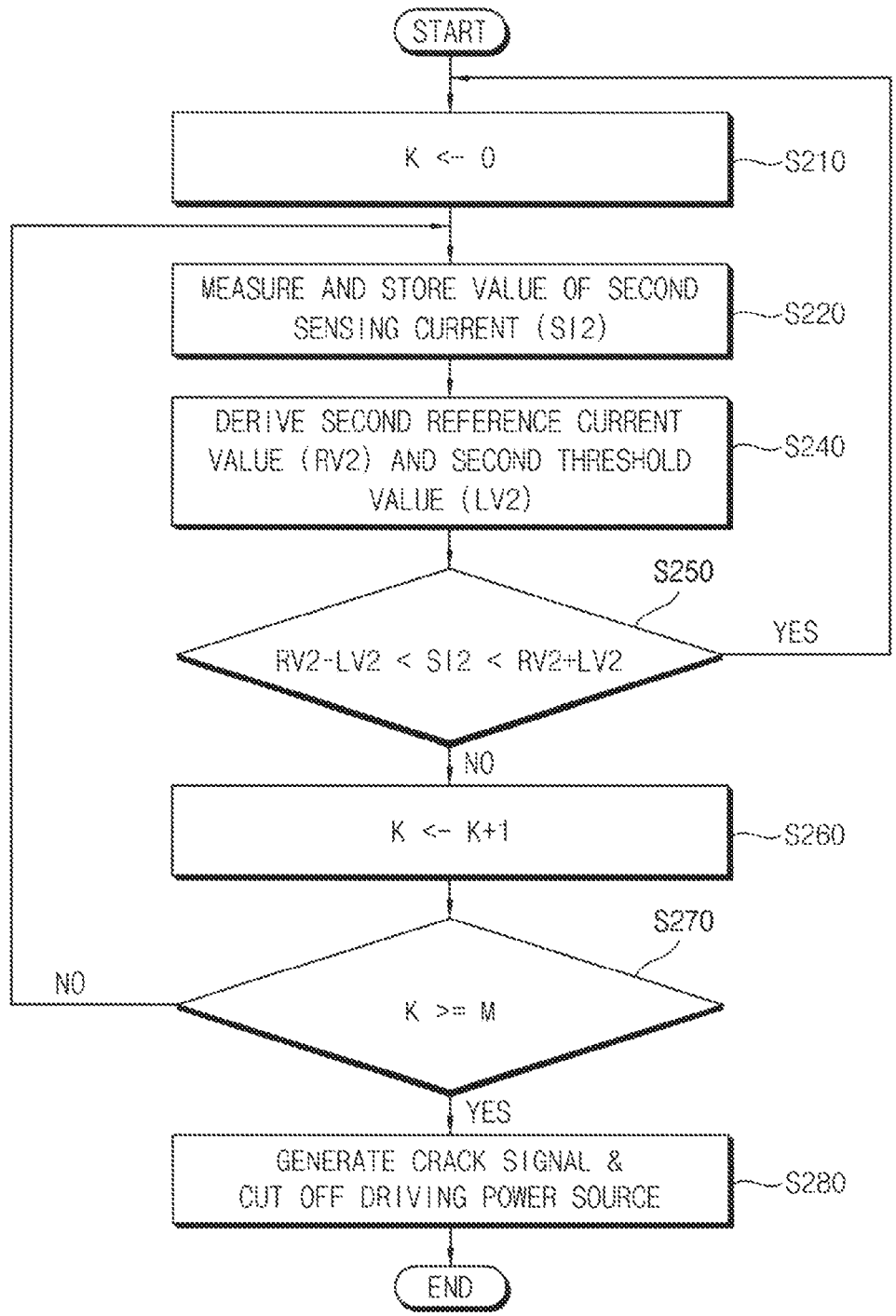
FIG. 9 is a flow chart illustrating an example of a method of detecting a crack in a display panel based on a second sensing current sensed during an emission period.

FIG. 9 is a flow chart illustrating an example of a method of detecting a crack in a display panel based on a second sensing current sensed during an emission period.

Referring to FIG. 9, a variable K may be initialized as 0 (S210). Here, K indicates the number of times that an abnormal current is sensed. The abnormal current indicates a sensing current out of a normal current range. The second sensing current SI2 flowing through the power line may be sensed during the emission period (S220).

A second reference current value RV2 and a second threshold value LV2 may be derived based on the input image data (S240). For example, the second reference current value RV2 and the second threshold value LV2 may be retrieved from a LUT storing values indicating the relationship between the input image data and a reference value (i.e., the second reference current value RV2 or the second threshold value LV2).

It is checked whether the second sensing current SI2 falls within a range of normal current values or not (S250). If the second sensing current SI2 is greater than a value obtained by subtracting the second threshold value LV2 from the second reference value RV2, and is smaller than a value obtained by adding the second reference value RV2 and the second threshold value LV2, the second sensing current SI2 may correspond to a normal current and the variable K may be initialized as 0 because the second sensing current SI2 falls within the normal current range (S210). On the other hand, if the second sensing current SI2 is less than or equal to the value obtained by subtracting the second threshold value LV2 from the second reference value RV2, or is greater than or equal to the value obtained by adding the second reference value RV2 and the second threshold value LV2, the second sensing current SI2 may correspond to an abnormal current and the variable K may be incremented by 1 (S260).

The variable K may be compared to a reference value M for crack detection (S270). If the variable K is smaller than the reference value M, a second sensing current is sensed in the next frame period and checked to determine whether the abnormal current is consistently sensed. On the other hand, if the variable K is greater than or equal to the reference value M, a crack in the display panel is deemed to have occurred. Accordingly, the crack signal may be generated and the driving power source may be cut off (S280).

Figure 10:
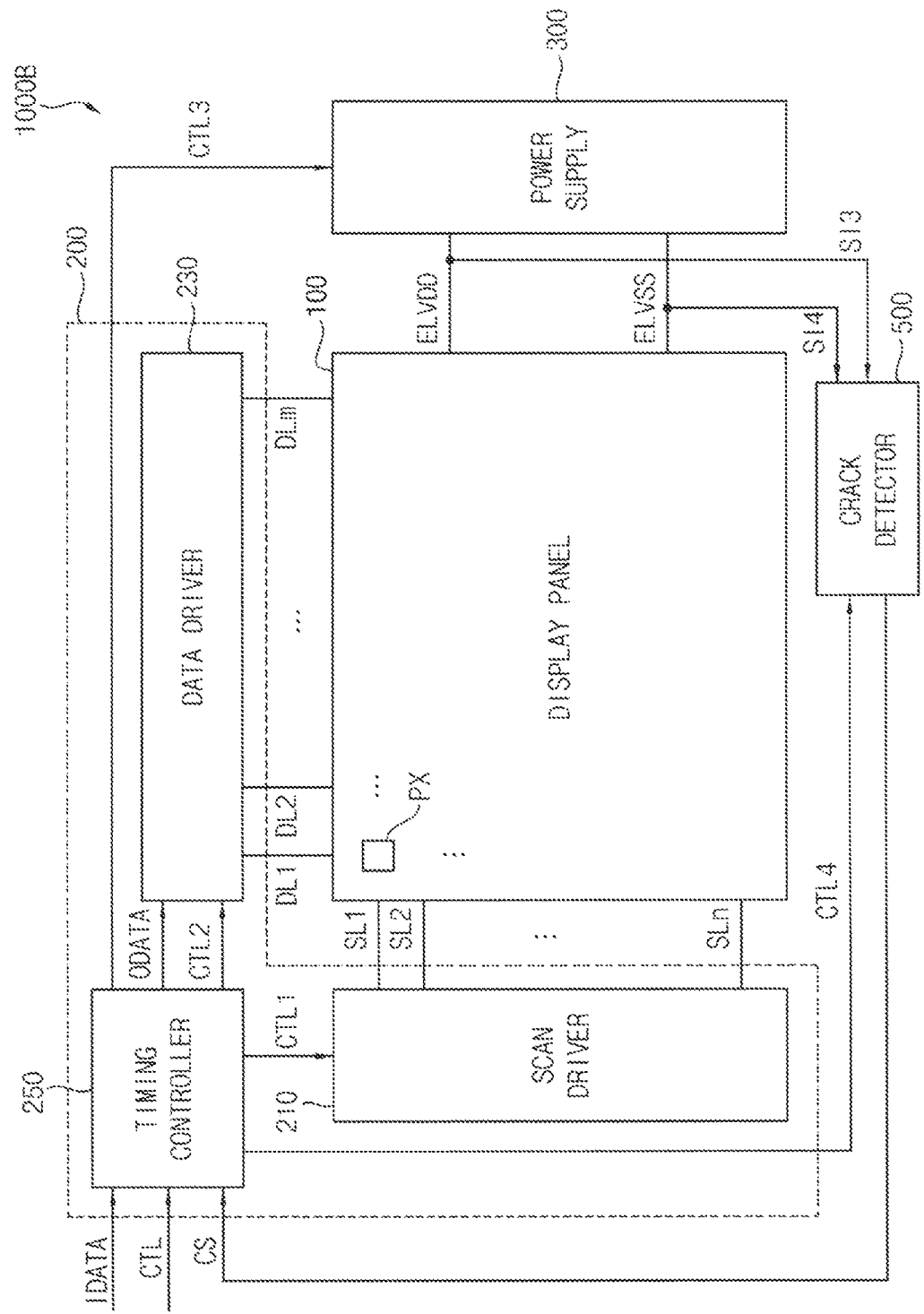
FIG. 10 is a block diagram illustrating a display device according to another example embodiment.
Figure 11:
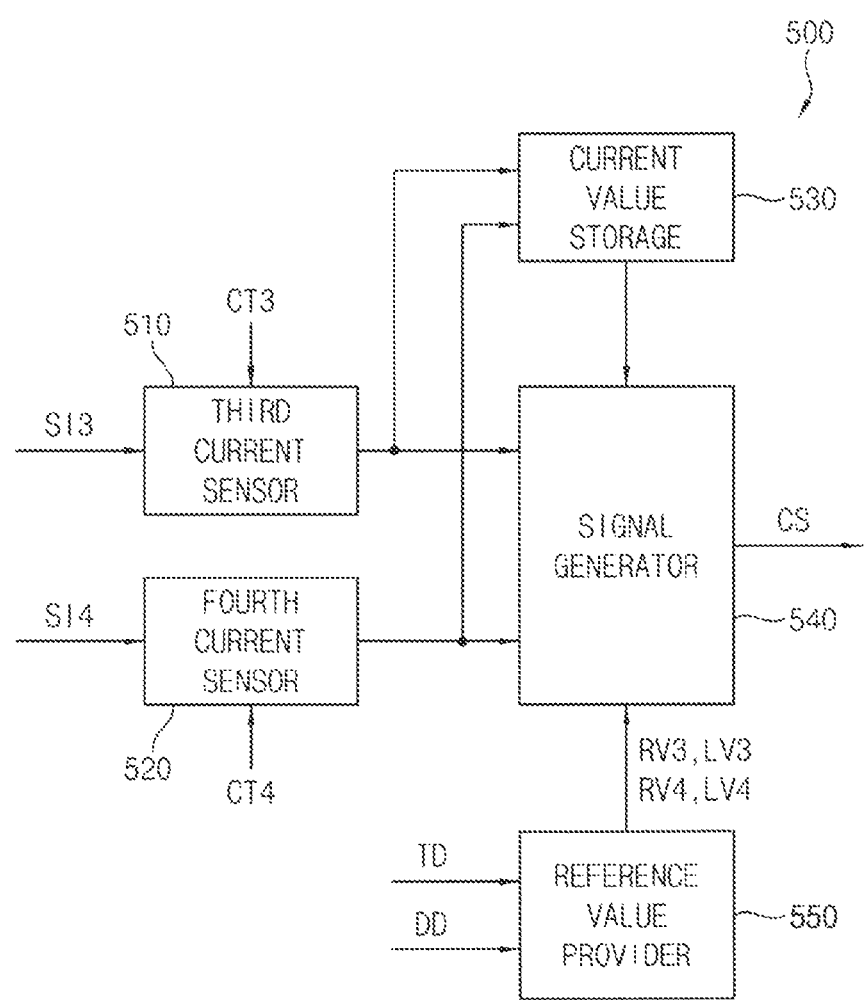
FIG. 11 is a block diagram illustrating an example of a crack detector included in a display device of FIG. 10.

FIG. 10 is a block diagram illustrating a display device according to another example embodiment. FIG. 11 is a block diagram illustrating an example of a crack detector included in a display device of FIG. 10.

Referring to FIGS. 10 and 11, the display device 1000B may include a display panel 100, a panel driver 200, a power supply 300, and a crack detector 500. The display device 1000B according to the present exemplary embodiment is substantially the same as the display device of the exemplary embodiment described in FIG. 1, except that the crack detector 500 is connected to both the first power line and the second power line. Therefore, the same reference numerals will be used to refer to the same or like parts as those described in the previous exemplary embodiment of FIG. 1, and any repetitive explanation concerning the above elements will be omitted.

The display panel 100 may include a plurality of pixels PX.

The panel driver 200 may provide a driving signal to the pixels PX of the display panel 100 to display an image. In one example embodiment, the panel driver 200 may include a scan driver 210, a data driver 230, and a timing controller 250.

The power supply 300 may provide a first power source ELVDD to the pixels PX via the first power line, and may provide a second power source ELVSS to the pixels PX via the second power line. In addition, the power supply 300 may cut off the first power source ELVDD and the second power source ELVSS based on the crack signal CS.

The crack detector 500 may sense a third sensing current SI3 flowing through the first power line, and a fourth sensing current SI4 flowing through the second power line. The crack detector 500 may monitor the third sensing current SI3 and the fourth sensing current SI4 during M successive frame periods, to generate the crack signal CS. If the crack detector only senses the fourth sensing current SI4, a crack may not be detected when a short circuit occurs between the first power line and the signal line. On the other hand, the crack detector may determine whether the crack occurs based on both the third sensing current SI3 and the fourth sensing current SI4, thereby improving the reliability of crack detection.

As shown in FIG. 11, the crack detector 500 may include a third current sensor 510, a fourth current sensor 520, a current value storage 530, a signal generator 540, and a reference value provider 550. The crack detector 500 according to the present exemplary embodiment is substantially the same as the crack detector of the exemplary embodiment described in FIG. 2, except that third and fourth current sensors 510, 520 are added instead of just a first current sensor. Therefore, the same reference numerals will be used to refer to the same or like parts as those described in the previous exemplary embodiment of FIG. 2, and any repetitive explanation concerning the above elements will be omitted.

The third current sensor 510 may measure a value of a third sensing current SI3 flowing through the first power line during the non-emission period in response to the third sensing control signal CT3, and may store the value of the third sensing current SI3 in the current value storage 530. The fourth current sensor 520 may measure a value of a fourth sensing current SI4 flowing through the second power line during the non-emission period in response to the fourth sensing control signal CT4, and may store the value of the fourth sensing current SI4 in the current value storage 530.

The signal generator 540 may derive an average value of the third sensing current SI3 detected over N successive frame periods, as well as an average value of the fourth sensing current SI4 detected over N successive frame periods, from the sensed current values stored in the current value storage 530. The signal generator 540 may generate the crack signal CS when a difference between the average value of the third sensing current SI3 and a third reference current value RV3 is greater than a third threshold value LV3 during the M successive frame periods, or when a difference between the average value of the fourth sensing current SI4 and a fourth reference current value RV4 is greater than a fourth threshold value LV3 during the M successive frame periods.

The reference value provider 550 may provide the third reference current value RV3, the third threshold value LV3, the fourth reference current value RV4, and the fourth threshold value LV4 to the signal generator 540. In one example embodiment, the reference value provider 550 may provide predetermined values of the third reference current value RV3, the third threshold value LV3, the fourth reference current value RV4, and the fourth threshold value LV4 to the signal generator 540. In another example embodiment, the reference value provider 550 may provide values of the third reference current value RV3, the third threshold value LV3, the fourth reference current value RV4, and the fourth threshold value LV4 that are adjusted according to driving environment (e.g., a temperature TD of the display panel, deterioration data DD of the pixels, etc.) to the signal generator 540.

Although a display device and a method of driving the display device according to example embodiments have been described with reference to the accompanying figures, those skilled in the art will readily appreciate that many modifications are possible in the example embodiments without materially departing from the novel teachings and advantages of the present inventive concept. For example, although the example embodiments describe that the panel driver drives the display panel in a simultaneous emission manner, the manner of driving the display panel is not limited thereto. For example, the panel driver may drive the display panel in a progressive emission manner. When driven in the progressive emission manner, the scan signal is progressively provided to the scan lines and pixels are driven to sequentially emit light on a row-by-row basis.

The present inventive concept may be applied to an electronic device having the display device. For example, the present inventive concept may be applied to a cellular phone, a smart phone, a smart pad, a personal digital assistant (PDA), etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims. Various features of the above described and other embodiments can thus be mixed and matched in any manner, to produce further embodiments consistent with the invention.

What is claimed is:

1. A display device comprising:
    a display panel including a plurality of pixels;
    a power supply configured to transmit driving power to the pixels via a power line and configured to stop transmission of the driving power in response to a crack signal;
    a panel driver configured to provide a driving signal to the pixels, the driving signal for displaying a black image during a non-emission period of each frame period and displaying a valid image during an emission period of each frame period; and
    a crack detector including a first current sensor configured to sense a first current flowing through the power line during the non-emission period of the each frame period and a signal generator connected to the first current sensor and configured to derive an average value of the first current over N successive frame periods and generate the crack signal when a difference between the average value of the first current and a first reference current value is continuously greater than a first threshold value for M successive frame periods, where M is an integer greater than 1.

2. The display device of claim 1, wherein the first current sensor is configured to measure a value of the first current flowing through the power line during the non-emission period of the each frame period and configured to store the measured value of the first sensed current in a current value storage; and
    the signal generator is configured to derive the average value of the first current from values of the first current that are sensed over the N successive frame periods and retrieved from the current value storage.

3. The display device of claim 2, wherein the crack detector further includes:
    a reference value provider configured to provide the first reference current value and the first threshold value to the signal generator.

4. The display device of claim 3, wherein the reference value provider is further configured to adjust the first reference current value and the first threshold value based on a temperature of the display panel.

5. The display device of claim 3, wherein the reference value provider is further configured to adjust the first reference current value and the first threshold value based on deterioration data of the pixels.

6. The display device of claim 2, wherein the crack detector further includes:
a second current sensor configured to measure a value of a second current flowing through the power line during the emission period of the each frame period.

7. The display device of claim 6, wherein the signal generator is further configured to derive an average value of the second current over the N successive frame periods and generate the crack signal when a difference between the average value of the second sensed current and a second reference current value is continuously greater than a second threshold value for the M successive frame periods.

8. The display device of claim 7, wherein the crack detector further includes:
a reference value provider configured to generate the second reference current value based on input image data and configured to provide the second reference current value and the second threshold value to the signal generator.

9. The display device of claim 1, wherein the crack detector includes:
a second current sensor configured to measure a value of a second current flowing through the power line during the emission period of the each frame period; and
a signal generator configured to generate the crack signal when a difference between the value of the sensed current and a second reference current value is greater than a second threshold value for each of the M successive frame periods.

10. The display device of claim 1, wherein the crack detector is further configured to sense the current every frame period.

11. The display device of claim 1, wherein the non-emission period includes an initialization period and a scan period, and
wherein the crack detector is further configured to sense the first current during the scan period.

12. The display device of claim 1, wherein each frame period includes a plurality of non-emission periods, and
wherein the crack detector is further configured to sense the first current during one of the non-emission periods in which the driving signal is maintained at a substantially constant voltage.

13. A display device comprising:
a display panel including a plurality of pixels;
a power supply configured to transmit first power to the pixels via a first power line, configured to supply second power to the pixels via a second power line, and configured to stop transmission of the first power and the second power based on a crack signal;
a panel driver configured to provide a driving signal; and
a crack detector including a current sensor configured to sense a current flowing through at least one selected from the first power line and the second power line during a non-emission period of each frame period, and a signal generator connected to the current sensor and configured to derive an average value of the current over N successive frame periods and generate the crack signal when a difference between the average value of the current and a first reference current value is continuously greater than a first threshold value for M successive frame periods, where M is an integer greater than 1.

14. The display device of claim 13, wherein the current sensor includes a first current sensor configured to measure a value of a first current flowing through the first power line and a second current sensor configured to measure a value of a second current flowing through the second power line; and
the signal generator is configured to generate the crack signal when a difference between an average value of the first current and the first reference current value is continuously greater than the first threshold value for the M successive frame periods, and when a difference between an average value of the second current and a second reference current value is continuously greater than a second threshold value for the M successive frame periods.

15. The display device of claim 14, wherein the crack detector further includes:
a reference value provider configured to generate the first reference current value and the second reference current value based on input image data, and configured to provide the first reference current value and the second reference current value to the signal generator.

16. The display device of claim 15, wherein the reference value provider is further configured to adjust the first reference current value and the second reference current value based on a temperature of the display panel.

17. The display device of claim 15, wherein the reference value provider is further configured to adjust the first reference current value and the second reference current value based on deterioration data of the pixels.

18. A method of driving a display device configured to display a black image during a non-emission period of each frame period and to display a valid image during an emission period of each frame period, the method comprising:
sensing a first current flowing through a power line during the non-emission period of the each frame period;
deriving an average value of the first current over N successive frame periods, where N is an integer greater than 1;
generating a crack signal when a difference between the average value of the first current and a first reference current value is continuously greater than a first threshold value for M successive frame periods, where M is an integer greater than 1; and
stopping transmission of a driving signal to the display device based on the crack signal.

19. The method of claim 18, further comprising:
sensing a second current flowing through the power line during the emission period of the each frame period;
deriving an average value of the second current over the N successive frame periods; and
generating the crack signal when a difference between the average value of the second current and a second reference current value is continuously greater than a second threshold value for the M successive frame periods.

20. The method of claim 19, wherein the second reference current value is adjusted based on input image data.

* * * * *